United States Patent
Kajiyama (10) Patent No.: US 8,268,656 B2
(45) Date of Patent: Sep. 18, 2012

(54) OPTICAL DEVICE WAFER PROCESSING METHOD

(75) Inventor: Keiichi Kajiyama, Ota-Ku (JP)

(73) Assignee: Disco Corporation, Tokyo (JP)

( * ) Notice: Subject to any disclaimer, the term of this patent is extended or adjusted under 35 U.S.C. 154(b) by 196 days.

(21) Appl. No.: 12/759,338

(22) Filed: Apr. 13, 2010

(65) Prior Publication Data
US 2010/0267219 A1    Oct. 21, 2010

(30) Foreign Application Priority Data

Apr. 20, 2009  (JP) ................................. 2009-102247

(51) Int. Cl.
*H01L 21/301* (2006.01)
*H01L 21/268* (2006.01)
*H01L 33/00* (2010.01)

(52) U.S. Cl. .......... 438/33; 438/462; 438/463; 438/795; 257/E21.237; 257/E21.238; 257/E21.347

(58) Field of Classification Search ............... 438/458, 438/459, 463, 33, 462, 795; 257/E21.237, 257/E21.238, E21.347
See application file for complete search history.

(56) References Cited

U.S. PATENT DOCUMENTS

| | | | |
|---|---|---|---|
| 7,134,943 B2 * | 11/2006 | Nagai et al. ................. | 451/41 |
| 7,608,523 B2 * | 10/2009 | Sekiya ........................ | 438/464 |
| 7,713,845 B2 * | 5/2010 | Morishige et al. ......... | 438/462 |
| 8,110,423 B2 * | 2/2012 | Okabe .......................... | 438/33 |
| 2006/0121697 A1 * | 6/2006 | Fujii et al. ..................... | 438/460 |
| 2007/0190748 A1 * | 8/2007 | Nakamura ................... | 438/460 |
| 2008/0032488 A1 * | 2/2008 | Chu et al. ..................... | 438/462 |
| 2008/0070380 A1 * | 3/2008 | Kusunoki ..................... | 438/462 |
| 2008/0076233 A1 * | 3/2008 | Morishige et al. .......... | 438/463 |
| 2008/0176491 A1 * | 7/2008 | Sekiya .......................... | 451/57 |
| 2008/0280421 A1 * | 11/2008 | Nakamura ................... | 438/462 |

FOREIGN PATENT DOCUMENTS
JP        2002-192370        7/2002
WO    WO 2008099838 A1  *  8/2008

* cited by examiner

*Primary Examiner* — Mary Wilczewski
*Assistant Examiner* — Toniae Thomas
(74) *Attorney, Agent, or Firm* — Greer, Burns & Crain, Ltd.

(57) ABSTRACT

An optical device wafer processing method including a protective plate attaching step of attaching a transparent protective plate through a double-sided adhesive tape to the front side of a sapphire substrate constituting an optical device wafer, the double-sided adhesive tape being composed of a sheet capable of blocking ultraviolet radiation and adhesive layers formed on both sides of the sheet, wherein the adhesive force of each adhesive layer can be reduced by applying ultraviolet radiation; a sapphire substrate grinding step of grinding the back side of the sapphire substrate; a modified layer forming step of applying a laser beam to the sapphire substrate from the back side thereof to thereby form a modified layer in the sapphire substrate along each street; a protective plate removing step of removing the protective plate in the condition where the double-sided adhesive tape is left on the sapphire substrate; and a wafer dividing step of breaking the sapphire substrate along each street where the modified layer is formed, thus dividing the optical device wafer into individual optical devices in the condition where the double-sided adhesive tape is left on the sapphire substrate.

2 Claims, 11 Drawing Sheets

OPTICAL DEVICE WAFER PROCESSING METHOD

BACKGROUND OF THE INVENTION

1. Field of the Invention

The present invention relates to an optical device wafer processing method for dividing an optical device wafer into individual optical devices along a plurality of crossing streets formed on the front side of a sapphire substrate constituting the optical device wafer, wherein the optical device wafer is formed by laminating gallium nitride compound semiconductors or the like, and the individual optical devices are respectively formed in a plurality of regions partitioned by the streets.

2. Description of the Related Art

A plurality of crossing division lines called streets are formed on the front side of a sapphire substrate to thereby partition a plurality of regions where optical devices such as light emitting diodes are respectively formed. An optical device wafer is formed by laminating gallium nitride compound semiconductors or the like on the sapphire substrate. The optical device wafer is divided along the streets to thereby obtain the individual optical devices, which are widely used in electric equipment.

As a method of dividing a platelike workpiece such as a semiconductor wafer, a laser processing method using a pulsed laser beam having a transmission wavelength to the workpiece has been proposed in recent years. In this laser processing method, the pulsed laser beam is applied to the workpiece along the streets in the condition where a focal point of the pulsed laser beam is set inside the workpiece in a subject area to be divided. In such a wafer dividing method using laser processing, the pulsed laser beam having a transmission wavelength to the wafer from one side thereof in the condition where the focal point is set inside the wafer, thereby continuously forming a modified layer inside the wafer along each street. By forming the modified layer along each street, the strength of the wafer along the modified layer is reduced. Accordingly, by applying an external force to the wafer along each street, the wafer can be divided into individual devices (see Japanese Patent No. 3408805, for example).

After laminating gallium nitride compound semiconductors or the like on the front side of the sapphire substrate to form the optical devices, the sapphire substrate becomes substantially unnecessary. Accordingly, the back side of the sapphire substrate is ground to reduce the thickness of the sapphire substrate before dividing the optical device wafer into the individual optical devices.

SUMMARY OF THE INVENTION

However, when the thickness of the sapphire substrate constituting the optical device wafer is reduced to 50 μm or less, there is a possibility of cracking in the sapphire substrate or damage to the sapphire substrate in attaching the wafer to a dicing tape before dividing the wafer into the individual optical devices.

Further, in the case of applying a laser beam along each street on the optical device wafer to form the modified layer and next dividing the optical device wafer along each street where the modified layer is formed to obtain the individual optical devices, minute broken pieces may scatter to be deposited onto the surface of each optical device, causing a degradation in quality of each optical device.

It is therefore an object of the present invention to provide an optical device wafer processing method which can prevent the damage to an optical device wafer in spite of its reduced thickness and can divide the wafer into individual optical devices without the deposition of minute broken pieces onto the surface of each optical device.

In accordance with an aspect of the present invention, there is provided an optical device wafer processing method for dividing an optical device wafer into individual optical devices along a plurality of crossing streets formed on the front side of a sapphire substrate constituting the optical device wafer, the individual optical devices being respectively formed in a plurality of regions partitioned by the streets, the optical device wafer processing method including: a protective plate attaching step of removably attaching a rigid protective plate through a double-sided adhesive tape to the front side of the sapphire substrate, the protective plate being formed from a transparent member, the double-sided adhesive tape being composed of a sheet capable of blocking ultraviolet radiation and first and second adhesive layers formed on both sides of the sheet, wherein the adhesive force of each adhesive layer of the double-sided adhesive tape can be reduced by applying ultraviolet radiation; a sapphire substrate grinding step of grinding the back side of the sapphire substrate to reduce the thickness of the sapphire substrate to a predetermined finished thickness of each optical device after performing the protective plate attaching step; a modified layer forming step of applying a laser beam having a transmission wavelength to the sapphire substrate along the streets from the back side of the sapphire substrate with a focal point set inside the sapphire substrate to thereby form a modified layer inside the sapphire substrate along each street after performing the sapphire substrate grinding step; a wafer supporting step of attaching the back side of the sapphire substrate to a dicing tape supported to an annular frame after performing the modified layer forming step; a protective plate removing step of applying ultraviolet radiation through the protective plate to the double-sided adhesive tape to thereby reduce the adhesive force of the first adhesive layer of the double-sided adhesive tape formed on the protective plate side and removing the protective plate from the double-sided adhesive tape in the condition where the double-sided adhesive tape is left on the front side of the sapphire substrate after performing the wafer supporting step; and a wafer dividing step of applying an external force to the sapphire substrate to thereby break the sapphire substrate along each street where the modified layer is formed, thus dividing the wafer into the individual optical devices after performing the protective plate removing step.

Preferably, the optical device wafer processing method further includes a double-sided adhesive tape removing step of applying ultraviolet radiation through the dicing tape and the sapphire substrate to the double-sided adhesive tape to thereby reduce the adhesive force of the second adhesive layer of the double-sided adhesive tape formed on the sapphire substrate side and removing the double-sided adhesive tape from the sapphire substrate after performing the wafer dividing step; and a pickup step of picking up the individual optical devices divided from each other and attached to the dicing tape from the dicing tape after performing the double-sided adhesive tape removing step.

In the optical device wafer processing method according to the present invention, the sapphire substrate grinding step of grinding the back side of the sapphire substrate constituting the optical device wafer to reduce the thickness of the sapphire substrate to a predetermined finished thickness of each optical device is performed after performing the protective plate attaching step of attaching the rigid protective plate through the double-sided adhesive tape to the front side of the sapphire substrate. Accordingly, although the thickness of the sapphire substrate is reduced to 50 μm or less, for example, there is no possibility of cracking in the sapphire substrate because the rigid protective plate is attached to the front side of the sapphire substrate.

Further, also in performing the modified layer forming step and the wafer supporting step after the sapphire substrate grinding step, there is no possibility of damage to the very thin sapphire substrate because the rigid protective plate is attached to the front side of the sapphire substrate.

In the wafer dividing step, an external force is applied to the sapphire substrate attached to the dicing tape in the condition where the double-sided adhesive tape is left on the front side of the sapphire substrate after performing the protective plate removing step, thereby breaking the sapphire substrate along each street where the modified layer is formed. Thus, the wafer is divided into the individual optical devices in the condition where the double-sided adhesive tape is attached to the front side of the sapphire substrate. When the sapphire substrate of the wafer is broken along each street so as to start from the modified layer serving as a break starting portion, minute broken pieces may scatter. However, the minute broken pieces adhere to the double-sided adhesive tape attached to the front side of the sapphire substrate, so that they are prevented from being deposited onto each optical device.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
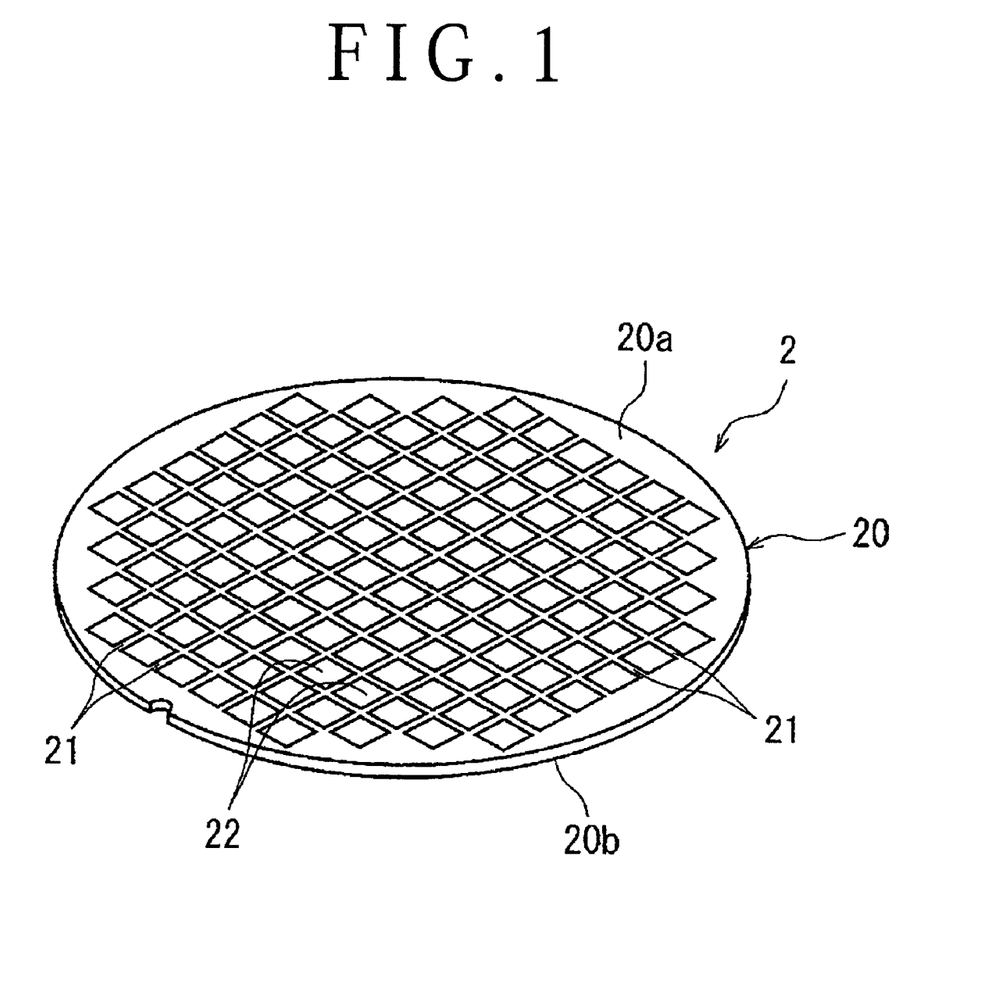
FIG. 1 is a perspective view of an optical device wafer to be divided into individual optical devices by the optical device wafer processing method according to the present invention.

A preferred embodiment of the optical device wafer processing method according to the present invention will now be described in detail with reference to the attached drawings. FIG. 1 is a perspective view of an optical device wafer 2 to be divided into individual optical devices by the optical device wafer processing method according to the present invention. The optical device wafer 2 shown in FIG. 1 is formed from a sapphire substrate 20 having a thickness of 300 μm, for example. The sapphire substrate 20 has a front side 20a and a back side 20b. A plurality of crossing streets 21 are formed on the front side 20a of the sapphire substrate 20 to thereby partition a plurality of rectangular regions where a plurality of optical devices 22 such as light emitting diodes are respectively formed.

Figure 2A:
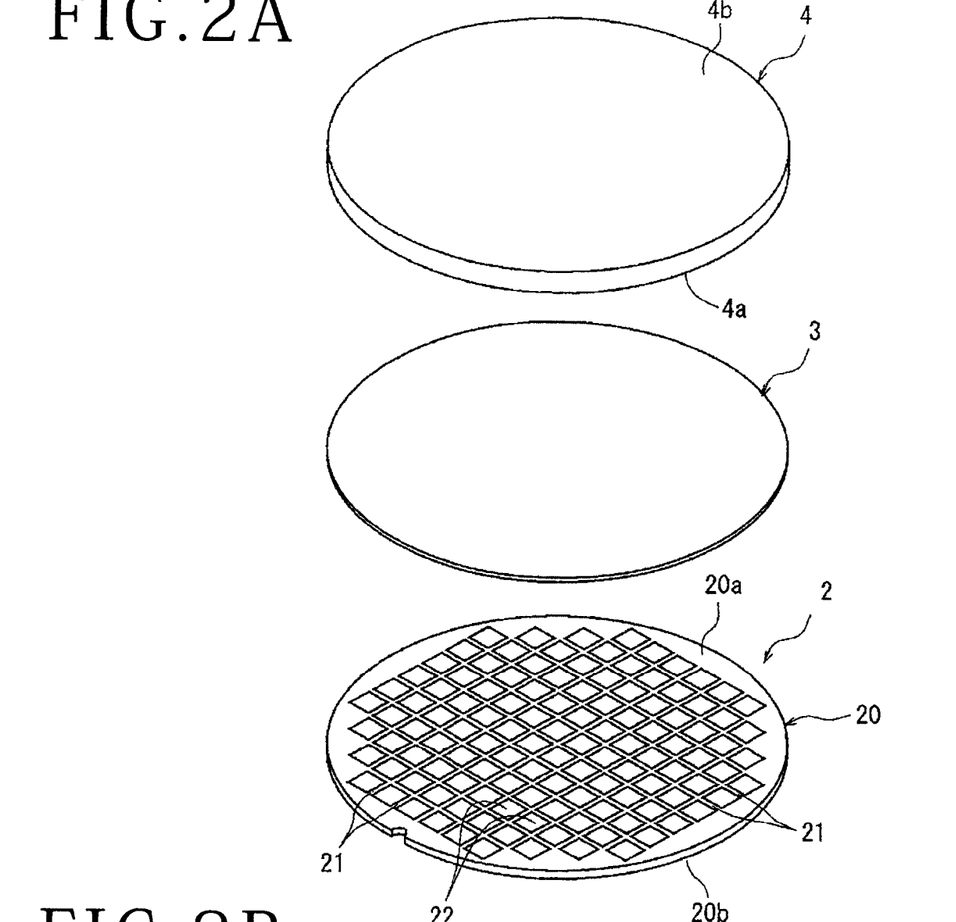
FIGS. 2A and 2B are perspective views for illustrating a protective plate attaching step in the optical device wafer processing method according to the present invention.
Figure 2B:
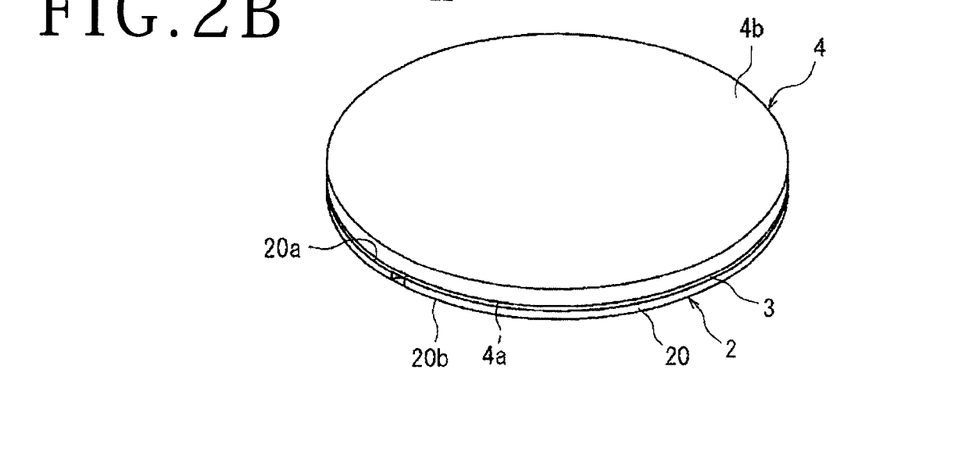

Prior to dividing the optical device wafer 2 into the individual optical devices 22 along the streets 21, a protective plate attaching step is performed as shown in FIGS. 2A and 2B in such a manner that a rigid protective plate 4 is removably attached through a double-sided adhesive tape 3 to the front side 20a of the sapphire substrate 20 constituting the optical device wafer 2. The double-sided adhesive tape 3 is composed of a sheet capable of blocking ultraviolet radiation and first and second adhesive layers formed on both sides of the sheet. The adhesive force of each adhesive layer of the double-sided adhesive tape 3 can be reduced by applying ultraviolet radiation. The rigid protective plate 4 is a circular transparent member formed of glass or acrylic resin, for example. The protective plate 4 has a flat front side 4a and a flat back side 4b, and the front side 4a of the protective plate 4 is attached through the double-sided adhesive tape 3 to the front side 20a of the sapphire substrate 20. The protective plate 4 has a thickness of 500 μm, for example.

After performing the protective plate attaching step, a sapphire substrate grinding step is performed in such a manner that the back side 20b of the sapphire substrate 20 is ground to reduce the thickness of the sapphire substrate 20 to a predetermined finished thickness as the thickness of each optical device 22 to be finally obtained. This sapphire substrate grinding step is performed by using a grinding apparatus 5 shown in FIG. 3. The grinding apparatus 5 shown in FIG. 3 includes a chuck table 51 for holding the wafer 2 and grinding means 52 for grinding the back side 20b of the sapphire substrate 20 constituting the wafer 2 held on the chuck table 51. The chuck table 51 has an upper surface as a holding surface for holding the wafer 2 under suction and is rotatable in the direction shown by an arrow A in FIG. 3. The grinding means 52 includes a spindle housing 521, a rotating spindle 522 rotatably supported to the spindle housing 521 so as to be rotated by a rotational driving mechanism (not shown), a mounter 523 mounted on the lower end of the rotating spindle 522, and a grinding wheel 524 mounted on the lower surface of the mounter 523. The grinding wheel 524 is composed of a disk-shaped base 525 and an abrasive ring 526 fixed to the lower surface of the base 525. The abrasive ring 526 is composed of a plurality of abrasive members annularly arranged at given intervals along the outer circumference of the base 525. The base 525 is mounted on the lower surface of the mounter 523 by means of bolts 527.

The sapphire substrate grinding step using the grinding apparatus 5 is performed in the following manner. The optical device wafer 2 with the protective plate 4 is held on the chuck table 51 under suction in the condition where the protective plate 4 attached through the double-sided adhesive tape 3 to the front side 20a of the sapphire substrate 20 constituting the wafer 2 is placed on the upper surface (holding surface) of the chuck table 51. Accordingly, the back side 20b of the sapphire substrate 20 constituting the wafer 2 held on the chuck table 51 is oriented upward. Thereafter, the chuck table 51 is rotated at 300 rpm, for example, in the direction shown by the arrow A, and the grinding wheel 524 of the grinding means 52 is rotated at 6000 rpm, for example, in the direction shown by an arrow B in FIG. 3. At the same time, a feed mechanism (not shown) is operated to lower the grinding wheel 524 until the abrasive ring 526 comes into contact with the back side 20b of the sapphire substrate 20. Thereafter, the grinding wheel 524 is fed downward by a predetermined amount at a predetermined feed rate. As a result, the back side 20b of the sapphire substrate 20 is ground to reduce the thickness of the sapphire substrate 20 to 50 μm, for example.

Figure 3:
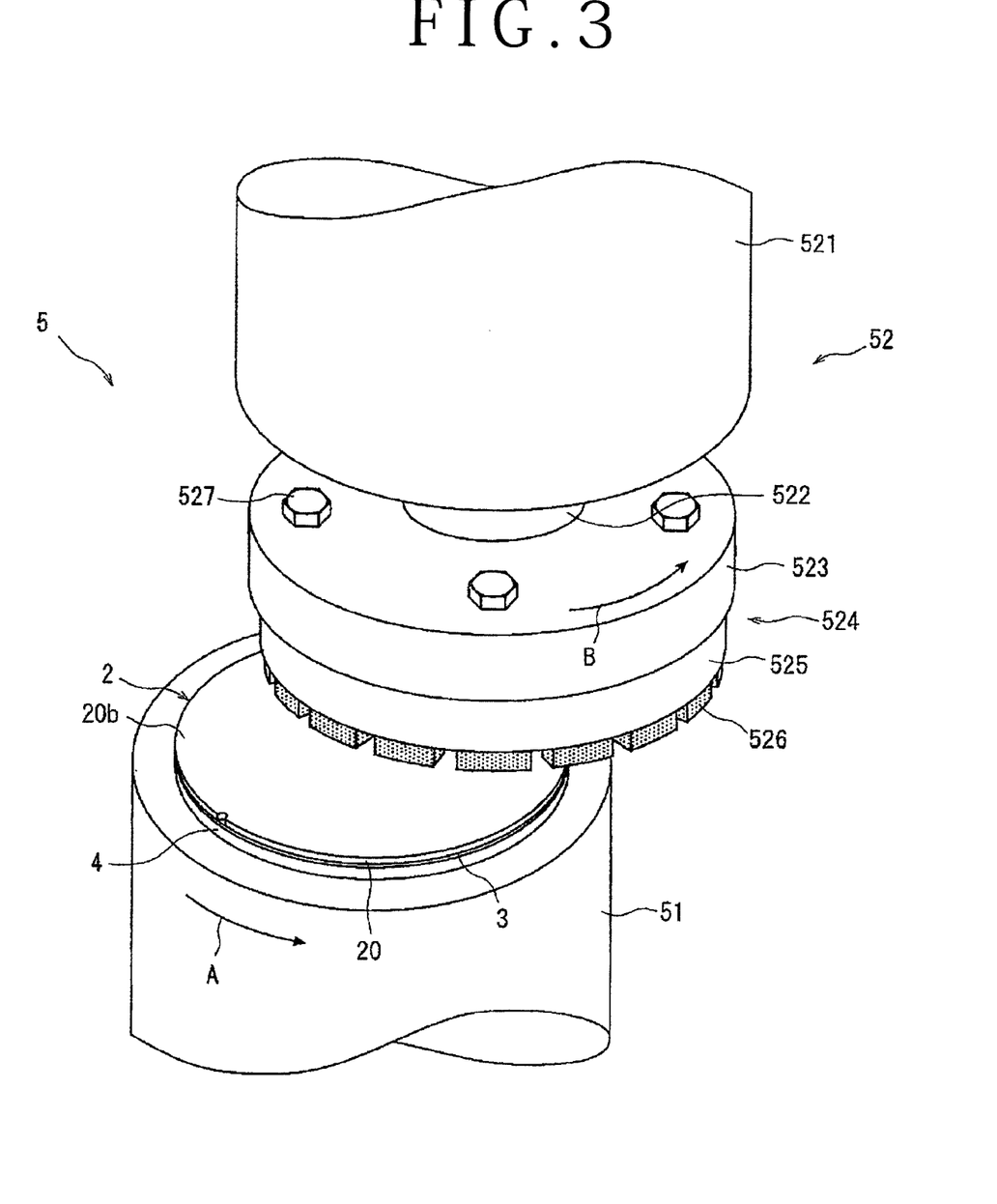
FIG. 3 is a perspective view for illustrating a sapphire substrate grinding step in the optical device wafer processing method according to the present invention.

Thus, the thickness of the sapphire substrate 20 constituting the optical device wafer 2 is reduced to a very small thickness of 50 μm by the sapphire substrate grinding step. However, there is no possibility of cracking in the sapphire substrate 20 because the rigid protective plate 4 is attached to the front side 20a of the sapphire substrate 20.

After performing the sapphire substrate grinding step, a modified layer forming step is performed in such a manner that a laser beam having a transmission wavelength to the sapphire substrate 20 is applied along the streets 21 from the back side 20b of the sapphire substrate 20 with a focal point set inside the sapphire substrate 20 to thereby form a modified layer inside the sapphire substrate 20 along each street 21. This modified layer forming step is performed by using a laser processing apparatus 6 shown in FIG. 4. The laser processing apparatus 6 shown in FIG. 4 includes a chuck table 61 for holding the wafer 2, laser beam applying means 62 for applying a laser beam to the wafer 2 held on the chuck table 61, and imaging means 63 for imaging the wafer 2 held on the chuck table 61. The chuck table 61 is so configured as to hold the wafer 2 by using suction means (not shown). The chuck table 61 is movable both in a feeding direction shown by an arrow X in FIG. 4 and in an indexing direction shown by an arrow Y in FIG. 4 by means of a moving mechanism (not shown).

Figure 4:
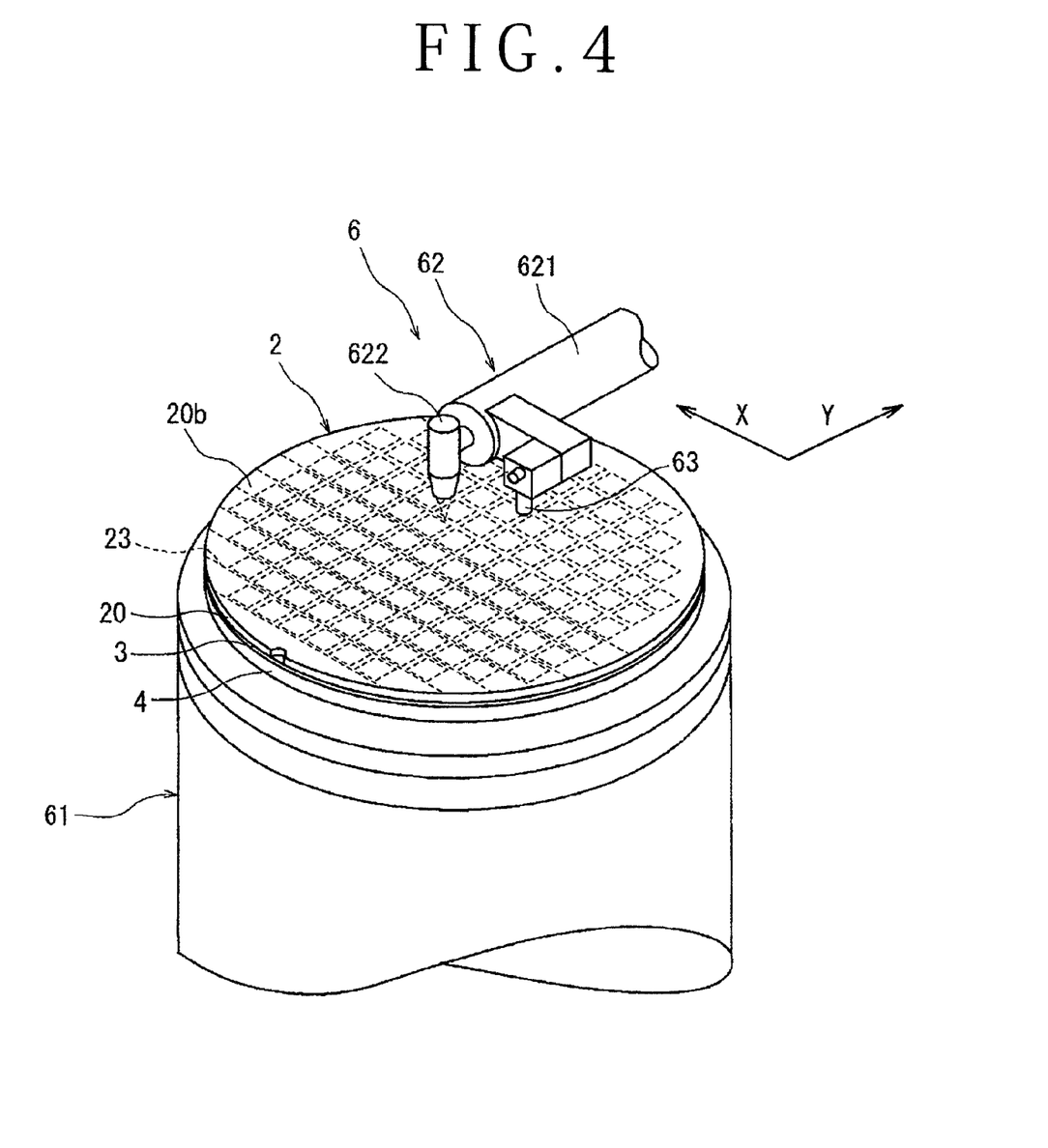
FIG. 4 is a perspective view of an essential part of a laser processing apparatus for performing a modified layer forming step in the optical device wafer processing method according to the present invention.

The laser beam applying means 62 includes a cylindrical casing 621 extending in a substantially horizontal direction. Although not shown, the casing 621 contains pulsed laser beam oscillating means including a pulsed laser beam oscillator and repetition frequency setting means. Examples of the pulsed laser beam oscillator include a YAG laser oscillator and a YVO4 laser oscillator. The laser beam applying means 62 further includes focusing means 622 mounted on the front end of the casing 621 for focusing the pulsed laser beam oscillated from the pulsed laser beam oscillating means.

The imaging means 63 is mounted on the front end portion of the casing 621 of the laser beam applying means 62. The imaging means 63 includes an ordinary imaging device (CCD) for imaging the wafer 2 by using visible light, infrared light applying means for applying infrared light to the wafer 2, an optical system for capturing the infrared light applied to the wafer 2 by the infrared light applying means, and an imaging device (infrared CCD) for outputting an electrical signal corresponding to the infrared light captured by the optical system. An image signal output from the imaging means 63 is transmitted to control means (not shown).

In performing the modified layer forming step by using the laser processing apparatus 6 shown in FIG. 4, the wafer 2 is first placed on the chuck table 61 in the condition where the protective plate 4 attached through the double-sided adhesive tape 3 to the front side 20a of the sapphire substrate 20 comes into contact with the upper surface of the chuck table 61, i.e., the back side 20b of the sapphire substrate 20 is oriented upward. Thereafter, the suction means is operated to hold the wafer 2 through the protective plate 4 on the chuck table 61 under suction (wafer holding step). Thereafter, the chuck table 61 thus holding the wafer 2 is moved to a position directly below the imaging means 63 by a moving mechanism (not shown).

In the condition where the chuck table 61 is positioned directly below the imaging means 63 by the moving mechanism (not shown), an alignment operation is performed by the imaging means 63 and the control means (not shown) to detect a subject area of the sapphire substrate 20 to be laser-processed. More specifically, the imaging means 63 and the control means perform imaging processing such as pattern matching for making the alignment of the streets 21 extending in a first direction on the sapphire substrate 20 of the wafer 2 and the focusing means 622 of the laser beam applying means 62 for applying the laser beam along the streets 21, thus performing the alignment of a laser beam applying position.

This alignment operation is performed similarly for the other streets 21 extending in a second direction perpendicular to the first direction mentioned above on the sapphire substrate 20 of the wafer 2 (alignment step). Although the front side 20a of the sapphire substrate 20 on which the streets 21 are formed is oriented downward as shown in FIG. 4, the streets 21 can be imaged from the back side 20b of the sapphire substrate 20 because the imaging means 63 includes the infrared light applying means, the optical system for capturing infrared light, and the imaging device (infrared CCD) for outputting an electrical signal corresponding to the infrared light as mentioned above. However, the infrared CCD is not always necessary because the sapphire substrate 20 can transmit visible light.

Figure 5A:
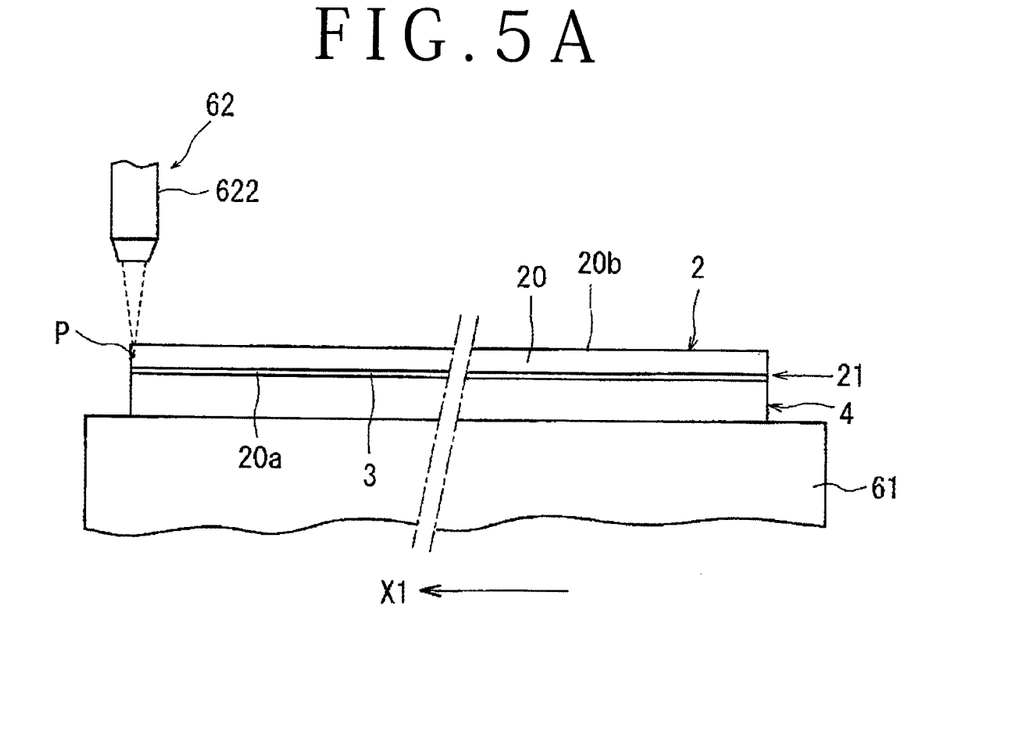
FIGS. 5A and 5B are sectional side views for illustrating the modified layer forming step using the laser processing apparatus shown in FIG. 4.
Figure 5B:
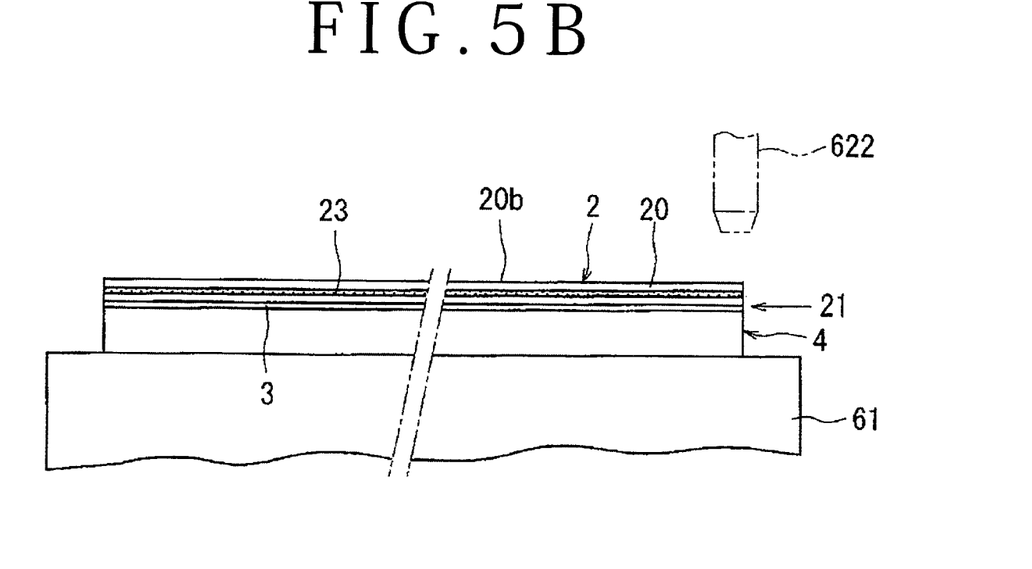

After performing the alignment step mentioned above, the chuck table 61 is moved to a laser beam applying area where the focusing means 622 of the laser beam applying means 62 is located as shown in FIG. 5A, thereby positioning one end (left end as viewed in FIG. 5A) of a predetermined one of the streets 21 directly below the focusing means 622 of the laser beam applying means 62. In this condition, a pulsed laser beam having a transmission wavelength to the sapphire substrate 20 is applied from the focusing means 622 to the sapphire substrate 20, and the chuck table 61 is moved in a direction shown by an arrow X1 in FIG. 5A at a predetermined feed speed. When the other end (right end as viewed in FIG. 5B) of the predetermined street 21 reaches the position directly below the focusing means 622 as shown in FIG. 5B, the application of the pulsed laser beam is stopped and the movement of the chuck table 61 is also stopped. As shown in FIG. 5A, the focal point P of the pulsed laser beam is set at the middle of the thickness of the sapphire substrate 20, so that a modified layer 23 is formed in the sapphire substrate 20 at the middle of the thickness thereof along the predetermined street 21 as shown in FIG. 5B.

For example, the modified layer forming step mentioned above is performed under the following processing conditions.

Light source: LD pumped Q-switched Nd:YVO4 pulsed laser
   Wavelength: 1064 nm
   Repetition frequency: 80 kHz
   Average power: 2 W
   Focused spot diameter: ϕ1 μm
   Work feed speed: 300 mm/second After performing the modified layer forming step along all of the streets 21 extending in the first direction, the chuck table 61 is rotated 90° to similarly perform the modified layer forming step along all of the other streets 21 extending in the second direction perpendicular to the first direction.

Figure 6A:
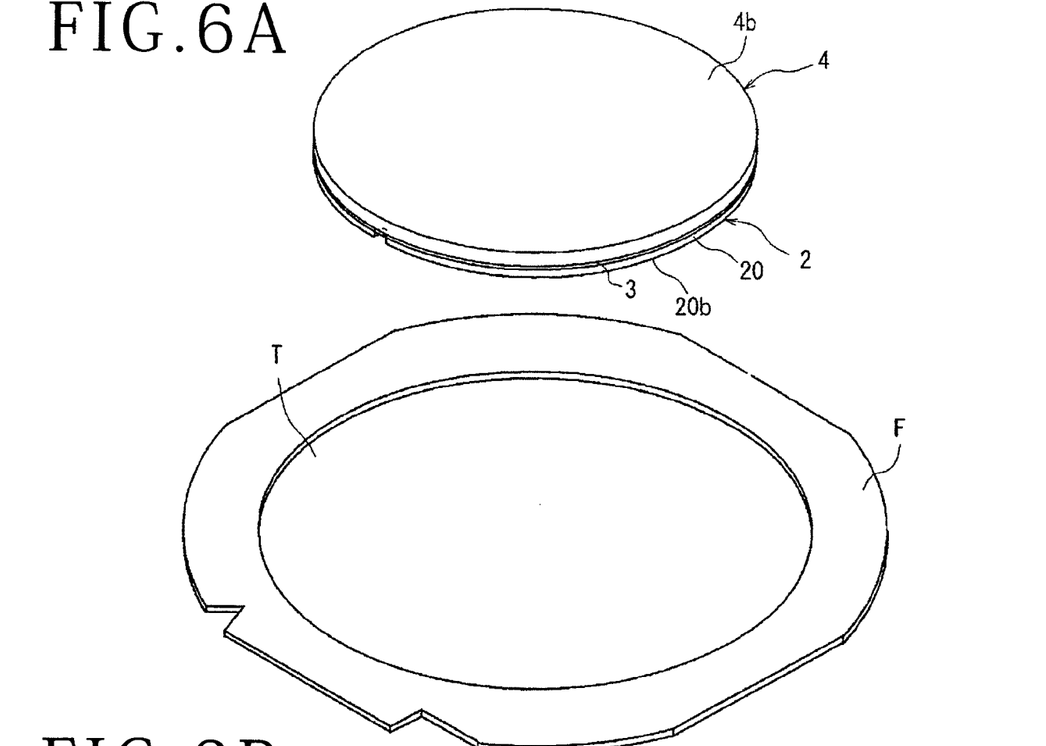
FIGS. 6A and 6B are perspective views for illustrating a wafer supporting step in the optical device wafer processing method according to the present invention.
Figure 6B:
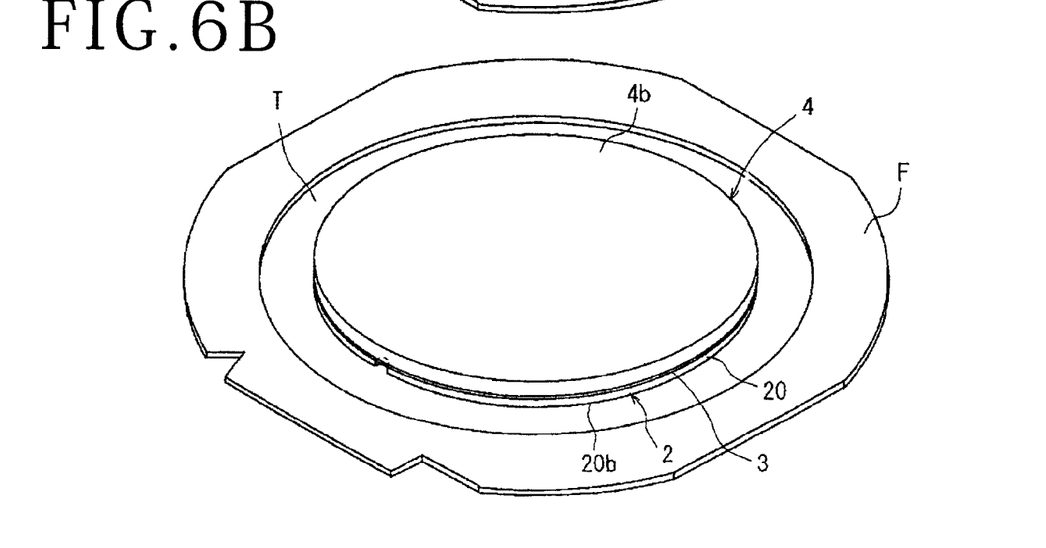

After thus finishing the modified layer forming step along all of the streets 21 extending in the first and second directions on the sapphire substrate 20, a wafer supporting step is performed in such a manner that the wafer 2 is attached to a dicing tape T supported to an annular frame F as shown in FIGS. 6A and 6B. More specifically, the dicing tape T is preliminarily supported at its outer circumferential portion to the annular frame F. The back side 20b of the sapphire substrate 20 of the wafer 2 is attached to the dicing tape T. Accordingly, the back side 4b of the protective plate 4 attached through the double-sided adhesive tape 3 to the front side 20a of the sapphire substrate 20 is oriented upward. Although the sapphire substrate 20 of the wafer 2 is very thin, the wafer supporting step can be performed without damage to the sapphire substrate 20 because the rigid protective plate 4 is attached to the sapphire substrate 20. The dicing tape T is composed of a resin sheet capable of transmitting ultraviolet radiation and an adhesive layer formed on the front side (upper surface as viewed in FIGS. 6A and 6B) of the resin sheet.

Figure 7A:
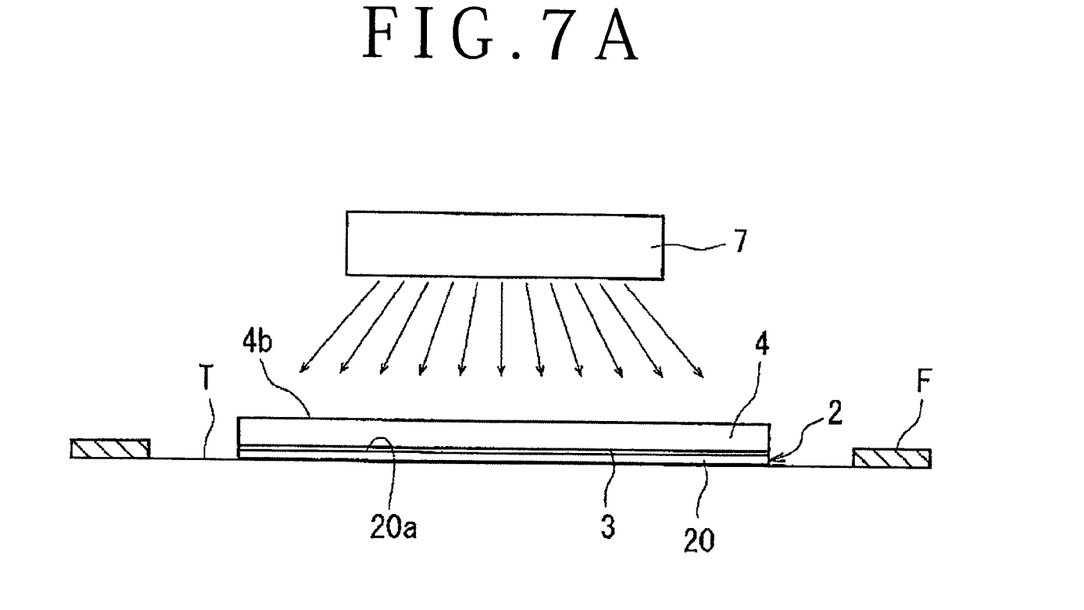
FIGS. 7A and 7B are sectional side views for illustrating a protective plate removing step in the optical device wafer processing method according to the present invention.
Figure 7B:
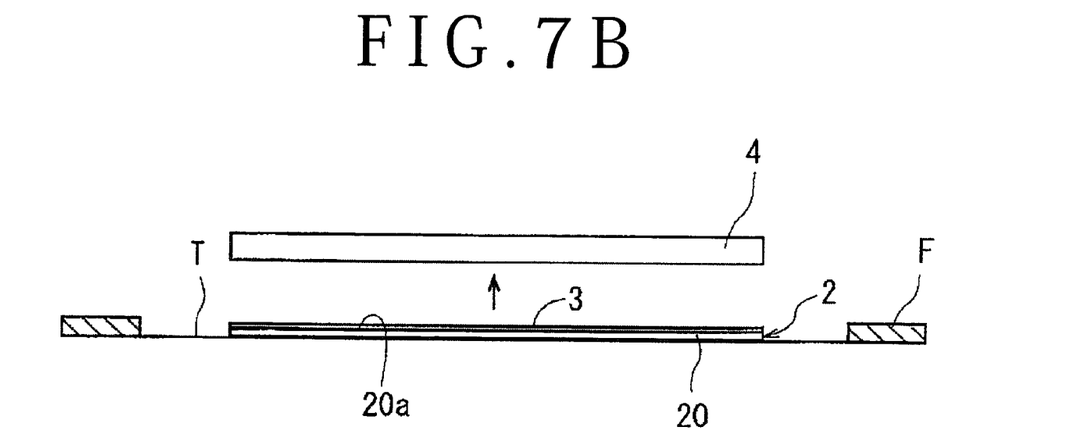

After performing the wafer supporting step, a protective plate removing step is performed as shown in FIGS. 7A and 7B in such a manner that ultraviolet radiation is applied through the protective plate 4 to the double-sided adhesive tape 3 to thereby reduce the adhesive force of the first adhesive layer of the double-sided adhesive tape 3 formed on the protective plate 4 side and that the protective plate 4 is next removed from the double-sided adhesive tape 3 in the condition where the double-sided adhesive tape 3 is left on the sapphire substrate 20. More specifically, as shown in FIG. 7A, ultraviolet radiation applying means 7 is used to apply ultraviolet radiation through the protective plate 4 to the double-sided adhesive tape 3. That is, the ultraviolet radiation applied from the ultraviolet radiation applying means 7 is transmitted through the protective plate 4 formed from a transparent member such as a glass plate to reach the first adhesive layer of the double-sided adhesive tape 3 formed on the protective plate 4 side.

As a result, the adhesive force of the first adhesive layer of the double-sided adhesive tape 3 is reduced by the application of the ultraviolet radiation. At this time, the adhesive force of the second adhesive layer of the double-sided adhesive tape 3 formed on the sapphire substrate 20 side is not reduced because the ultraviolet radiation applied from the ultraviolet radiation applying means 7 is blocked by the sheet constituting the double-sided adhesive tape 3. After applying the ultraviolet radiation to the wafer 2 to reduce the adhesive force of the first adhesive layer of the double-sided adhesive tape 3 formed on the protective plate 4 side, the protective plate 4 is removed from the double-sided adhesive tape 3 as shown in FIG. 7B. At this time, the protective plate 4 can be easily removed because the adhesive force of the first adhesive layer of the double-sided adhesive tape 3 formed on the protective plate 4 side has been reduced. However, the double-sided adhesive tape 3 remains attached to the front side 20a of the sapphire substrate 20 because the adhesive force of the second adhesive layer of the double-sided adhesive tape 3 has not been reduced.

Figure 8A:
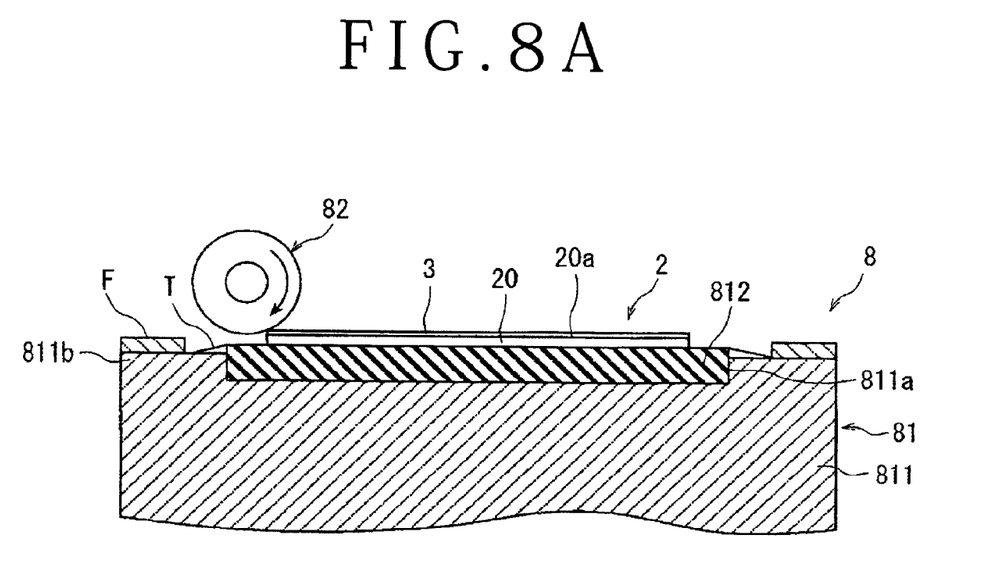
FIGS. 8A and 8B are sectional side views for illustrating a wafer dividing step in the optical device wafer processing method according to the present invention.

After performing the protective plate removing step, a wafer dividing step is performed in such a manner that an external force is applied to the sapphire substrate 20 of the wafer 2 attached to the dicing tape T to thereby break the sapphire substrate 20 along each street 21 where the modified layer 23 is formed, thus dividing the wafer 2 into the individual optical devices 22. This wafer dividing step is performed by using a wafer breaking apparatus 8 shown in FIG. 8A. The wafer breaking apparatus 8 shown in FIG. 8A includes a table 81 for setting the wafer 2 thereon and a pressure roller 82 for applying an external force to the wafer 2 set on the table 81. The table 81 includes a solid cylindrical table body 811 and an elastic member 812 fitted in a circular recess 811a formed on the upper surface of the table body 811. The elastic member 812 is formed from a soft rubber sheet, for example. The wafer 2 attached to the dicing tape T is placed on the table 81. More specifically, the sapphire substrate 20 of the wafer 2 is placed through the dicing tape T on the elastic member 812. That is, the back side (lower surface) of the dicing tape T is in contact with the upper surface of the elastic member 812. The annular frame F supporting the dicing tape T is placed on an annular holding portion 811b formed on the upper surface of the table body 811 so as to surround the elastic member 812.

Figure 8B:
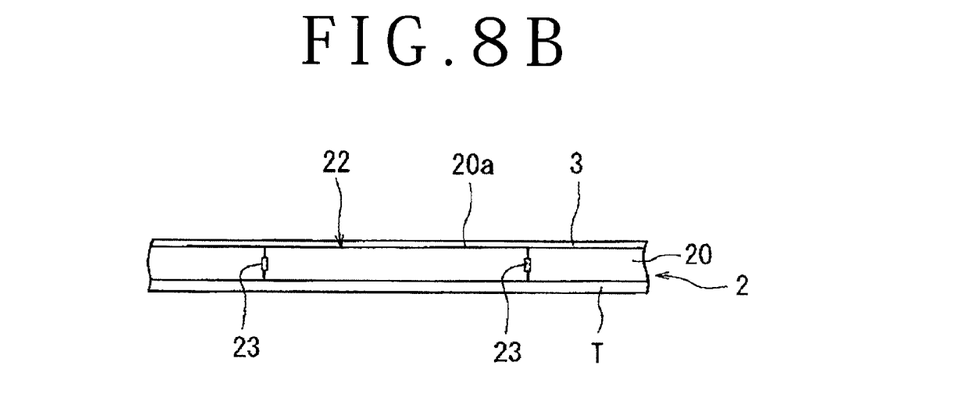

The upper surface of the double-sided adhesive tape 3 attached to the front side 20a of the sapphire substrate 20 of the wafer 2 is pressed by the pressure roller 82 being rolled. As a result, the sapphire substrate 20 is broken along each street 21 where the modified layer 23 is formed and functions as a break starting portion, thus dividing the sapphire substrate 20 into the individual optical devices 22 as shown in FIG. 8B. At this time, the individual optical devices 22 divided from each other remain attached to the dicing tape T and maintain the form of the wafer 2. When the sapphire substrate 20 of the wafer 2 is broken along each street 21 so as to start from the modified layer 23 serving as a break starting portion, minute broken pieces may scatter. However, the minute broken pieces adhere to the double-sided adhesive tape 3 attached to the front side 20a of the sapphire substrate 20, so that they are prevented from being deposited onto each optical device 22.

Figure 9A:
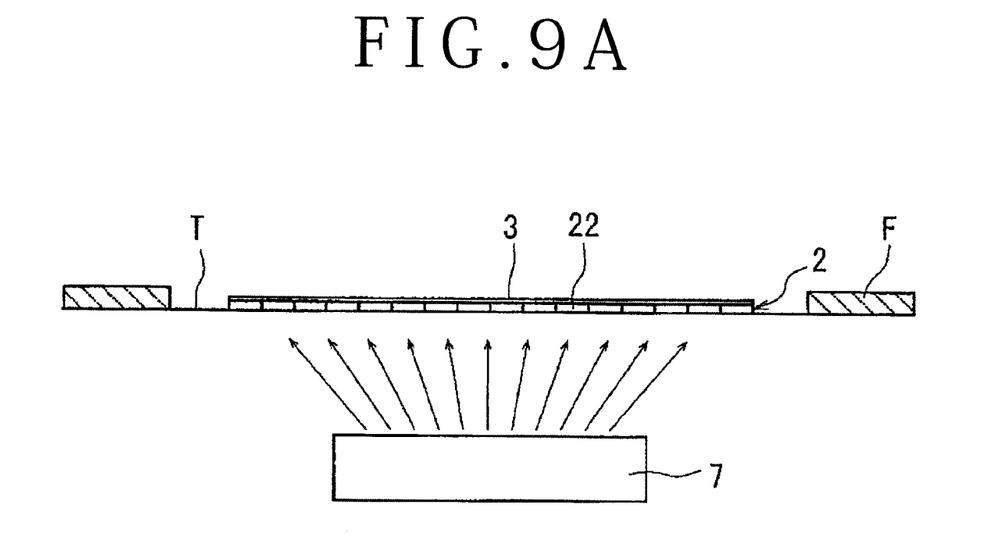
FIGS. 9A and 9B are sectional side views for illustrating a double-sided adhesive tape removing step in the optical device wafer processing method according to the present invention.
Figure 9B:
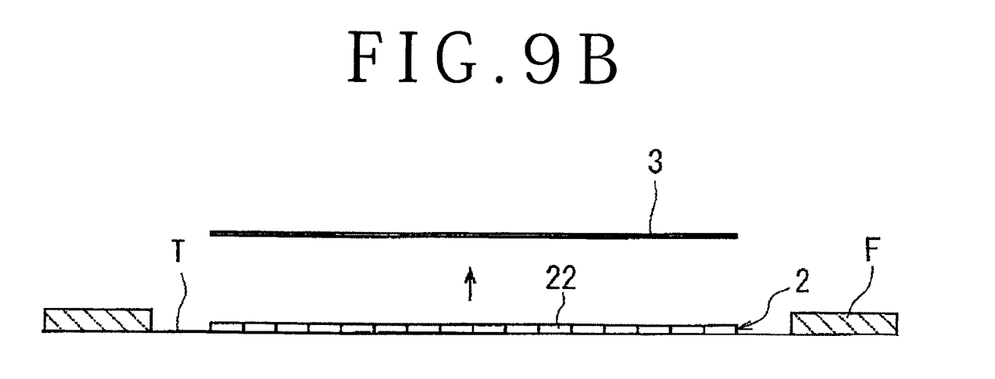

After performing the wafer dividing step, a double-sided adhesive tape removing step is performed as shown in FIGS. 9A and 9B in such a manner that ultraviolet radiation is applied through the dicing tape T and the sapphire substrate 20 to the double-sided adhesive tape 3 to thereby reduce the adhesive force of the second adhesive layer of the double-sided adhesive tape 3 formed on the sapphire substrate 20 side and that the double-sided adhesive tape 3 is next removed from the sapphire substrate 20. More specifically, as shown in FIG. 9A, the ultraviolet radiation applying means 7 is used to apply ultraviolet radiation through the dicing tape T and the sapphire substrate 20 to the double-sided adhesive tape 3. That is, the ultraviolet radiation applied from the ultraviolet radiation applying means 7 is transmitted through the dicing tape T formed from a resin sheet capable of transmitting ultraviolet radiation and further transmitted through the sapphire substrate 20 to reach the second adhesive layer of the double-sided adhesive tape 3 formed on the sapphire substrate 20 side. As a result, the adhesive force of the second adhesive layer of the double-sided adhesive tape 3 is reduced by the application of the ultraviolet radiation. After applying the ultraviolet radiation to the wafer 2 to reduce the adhesive force of the second adhesive layer of the double-sided adhesive tape 3 formed on the sapphire substrate 20 side, the double-sided adhesive tape 3 is removed from the sapphire substrate 20 as shown in FIG. 9B.

After performing the double-sided adhesive tape removing step, a pickup step is performed in such a manner that the individual optical devices 22 divided from each other and attached to the dicing tape T are picked up from the dicing tape T. This pickup step is performed by using a pickup apparatus 9 shown in FIG. 10. The pickup apparatus 9 shown in FIG. 10 includes frame holding means 91 for holding the annular frame F and tape expanding means 92 for expanding the dicing tape T supported to the annular frame F held by the frame holding means 91. The frame holding means 91 includes an annular frame holding member 911 and a plurality of clamps 912 as fixing means provided on the outer circumference of the frame holding member 911. The upper surface of the frame holding member 911 functions as a mounting surface 911a for mounting the annular frame F thereon. The annular frame F mounted on the mounting surface 911a is fixed to the frame holding member 911 by the clamps 912. The frame holding means 91 is supported by the tape expanding means 92 so as to be vertically movable.

Figure 10:
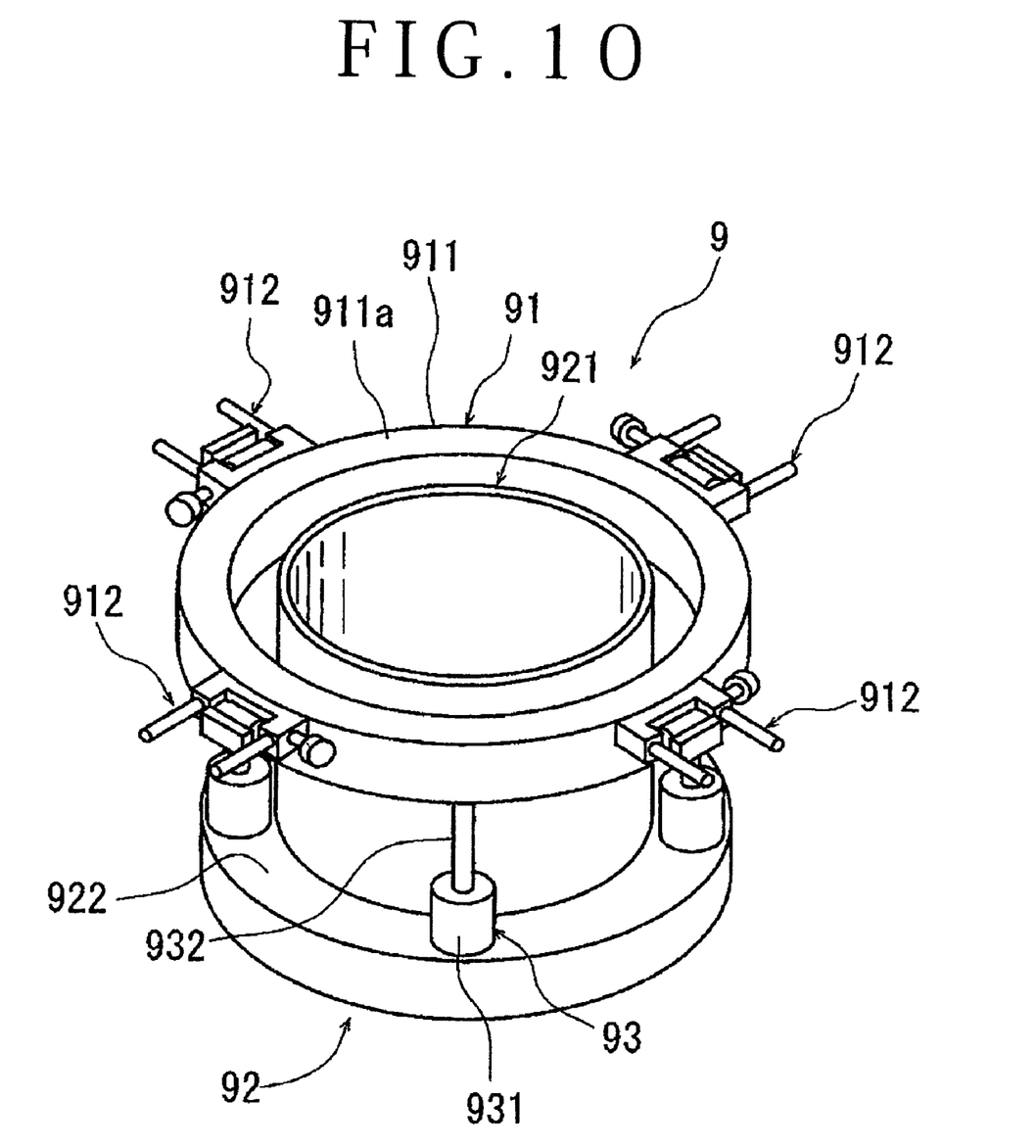
FIG. 10 is a perspective view of a pickup apparatus for performing a pickup step in the optical device wafer processing method according to the present invention.

The tape expanding means 92 includes an expanding drum 921 provided inside of the annular frame holding member 911. The expanding drum 921 has an outer diameter smaller than the inner diameter of the annular frame F and an inner diameter larger than the outer diameter of the wafer 2 (which has already been divided into the individual optical devices 22) attached to the dicing tape T supported to the annular frame F. The expanding drum 921 has a supporting flange 922 at the lower end of the drum 921. The tape expanding means 92 further includes supporting means 93 for vertically movably supporting the annular frame holding member 911. The supporting means 93 is composed of a plurality of air cylinders 931 provided on the supporting flange 922. Each air cylinder 931 is provided with a piston rod 932 connected to the lower surface of the annular frame holding member 911. The supporting means 93 composed of these plural air cylinders 931 functions to vertically move the annular frame holding member 911 so as to selectively take a reference position where the mounting surface 911a is substantially equal in height to the upper end of the expanding drum 921 and an expansion position where the mounting surface 911a is lower in height than the upper end of the expanding drum 921 by a predetermined amount. Accordingly, the supporting means 93 functions as moving means for relatively moving the expanding drum 921 and the annular frame holding member 911 in the vertical direction.

Figure 11A:
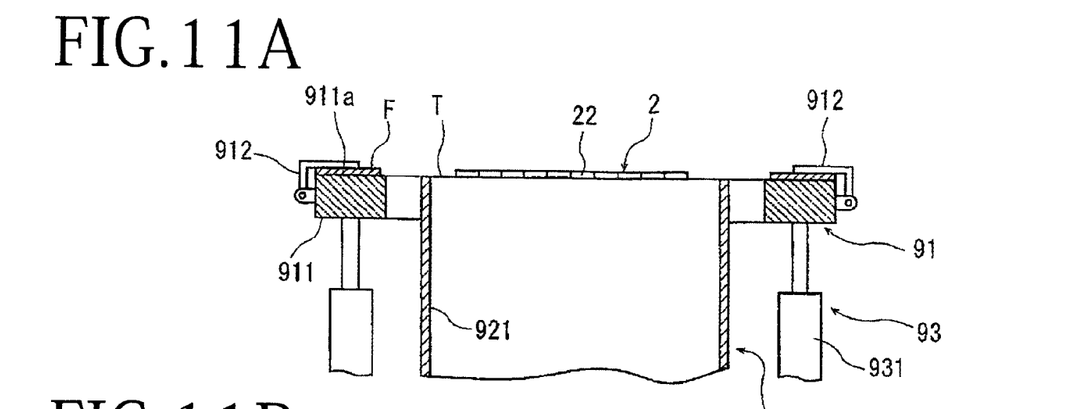
FIGS. 11A to 11C are sectional side views for illustrating the pickup step using the pickup apparatus shown in FIG. 10.

The pickup step using the pickup apparatus 9 will now be described with reference to FIGS. 11A to 11C. As shown in FIG. 11, the annular frame F supporting the wafer 2 through the dicing tape T (the wafer 2 being divided into the individual optical devices 22) is mounted on the mounting surface 911a of the frame holding member 911 of the frame holding means 91 and fixed to the frame holding member 911 by the clamps 912. At this time, the frame holding member 911 is set at the reference position shown in FIG. 11A. Thereafter, the air cylinders 931 as the supporting means 93 of the tape expanding means 92 are operated to lower the frame holding member 911 to the expansion position shown in FIG. 11B.

Figure 11B:
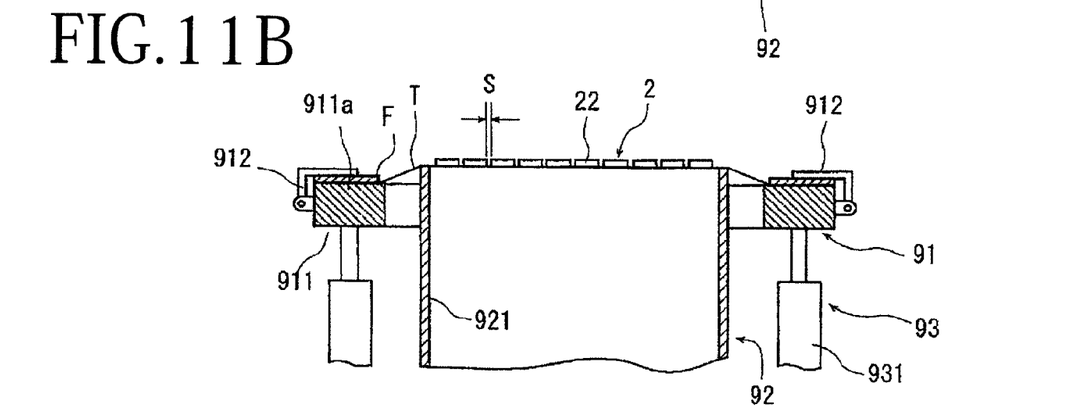
Figure 11C:
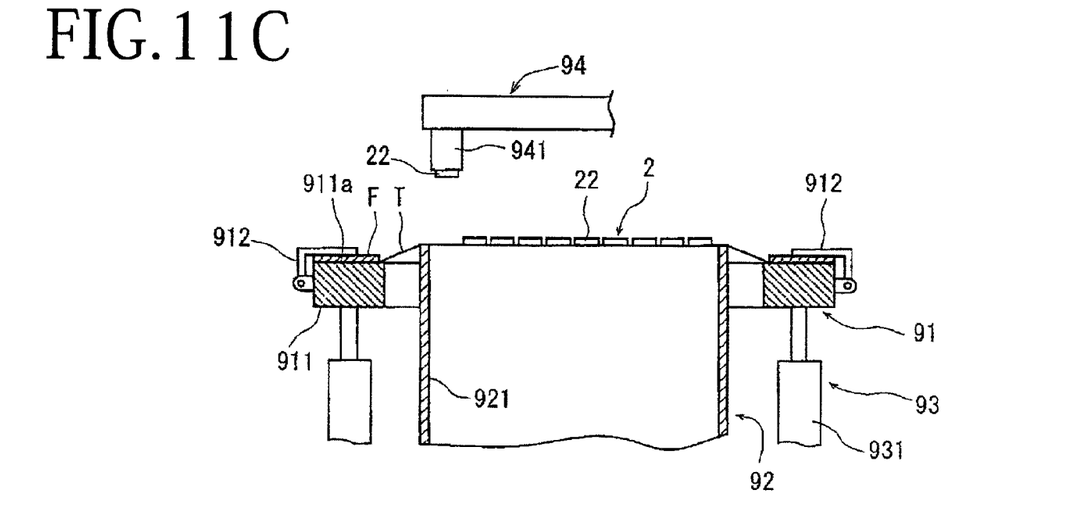

Accordingly, the annular frame F fixed to the mounting surface 911a of the frame holding member 911 is also lowered, so that the dicing tape T supported to the annular frame F comes into abutment against the upper end of the expanding drum 921 and is expanded as shown in FIG. 11B. As a result, the spacing S between any adjacent ones of the individual optical devices 22 attached to the dicing tape T is increased as shown in FIG. 11B. Thereafter, as shown in FIG. 11C, a pickup mechanism 94 having a pickup collet 941 is operated to hold each optical device 22 under suction and peel off from the dicing tape T through the pickup collet 941. Each optical device 22 thus picked up by the pickup mechanism 94 is transported to a tray (not shown). In this pickup step, the spacing S between any adjacent ones of the individual optical devices 22 is increased, so that each optical device 22 can be easily picked up without the contact with its adjacent optical device 22.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An optical device wafer processing method for dividing an optical device wafer into individual optical devices along a plurality of crossing streets formed on a front side of a sapphire substrate constituting said optical device wafer, said individual optical devices being respectively formed in a plurality of regions partitioned by said streets, said optical device wafer processing method, comprising:
    a protective plate attaching step of removably attaching a rigid protective plate through a double-sided adhesive tape to the front side of said sapphire substrate, said protective plate being formed from a transparent member, said double-sided adhesive tape being composed of a sheet blocking ultraviolet radiation and first and second adhesive layers formed on both sides of said sheet, wherein an adhesive force of each adhesive layer of said double-sided adhesive tape is reduced by applying ultraviolet radiation;
    a sapphire substrate grinding step of grinding a back side of said sapphire substrate to reduce the thickness of said sapphire substrate to a predetermined finished thickness of each optical device after performing said protective plate attaching step;
    a modified layer forming step of applying a laser beam having a transmission wavelength to said sapphire substrate along said streets from the back side of said sapphire substrate with a focal point set inside said sapphire substrate to thereby form a modified layer inside said sapphire substrate along each street after performing said sapphire substrate grinding step;
    a wafer supporting step of attaching the back side of said sapphire substrate to a dicing tape supported to an annular frame after performing said modified layer forming step;
    a protective plate removing step of applying ultraviolet radiation through said protective plate to said double-sided adhesive tape to thereby reduce the adhesive force of said first adhesive layer of said double-sided adhesive tape formed on said protective plate side and removing said protective plate from said double-sided adhesive tape in the condition where said double-sided adhesive tape is left on the front side of said sapphire substrate after performing said wafer supporting step; and
    a wafer dividing step of applying an external force to said sapphire substrate to thereby break said sapphire substrate along each street where said modified layer is formed, thus dividing said wafer into said individual optical devices after performing said protective plate removing step.

2. The optical device wafer processing method according to claim 1, further comprising:
    a double-sided adhesive tape removing step of applying ultraviolet radiation through said dicing tape and said sapphire substrate to said double-sided adhesive tape to thereby reduce the adhesive force of said second adhesive layer of said double-sided adhesive tape formed on said sapphire substrate side and removing said double-sided adhesive tape from said sapphire substrate after performing said wafer dividing step; and
    a pickup step of picking up said individual optical devices divided from each other and attached to said dicing tape from said dicing tape after performing said double-sided adhesive tape removing step.

* * * * *